(12) United States Patent
Kuno et al.

(10) Patent No.: US 7,087,974 B2
(45) Date of Patent: *Aug. 8, 2006

(54) SEMICONDUCTOR INTEGRATED CIRCUIT INCLUDING ANTI-FUSE AND METHOD FOR MANUFACTURING THE SAME

(75) Inventors: Isamu Kuno, Mihama-ku (JP); Tomoharu Katagiri, Mihama-ku (JP)

(73) Assignee: Kawasaki Microelectronics Inc., Chiba (JP)

( * ) Notice: Subject to any disclaimer, the term of this patent is extended or adjusted under 35 U.S.C. 154(b) by 169 days.

This patent is subject to a terminal disclaimer.

(21) Appl. No.: 10/773,213

(22) Filed: Feb. 9, 2004

(65) Prior Publication Data

US 2004/0159907 A1 Aug. 19, 2004

(30) Foreign Application Priority Data

Feb. 14, 2003 (JP) ............................. 2003-036847

(51) Int. Cl.
*H01L 29/76* (2006.01)

(52) U.S. Cl. .................. 257/529; 257/528; 257/530; 438/132; 438/215; 438/281; 438/333

(58) Field of Classification Search ......... 257/528–530; 438/132, 215, 281, 333
See application file for complete search history.

(56) References Cited

U.S. PATENT DOCUMENTS

| 4,449,158 | A | 5/1984 | Taira et al. |
| 4,480,318 | A | 10/1984 | Chong |
| 4,646,427 | A | 3/1987 | Doyle |
| 4,692,781 | A | 9/1987 | Rountree et al. |
| 5,019,878 | A | 5/1991 | Yang et al. |
| 5,068,696 | A | 11/1991 | Yang et al. |
| 5,163,180 | A | 11/1992 | Eltoukhy et al. |
| 5,257,222 | A | 10/1993 | Lee |
| 5,301,159 | A | 4/1994 | Lee |
| 5,646,438 | A | 7/1997 | Frerichs |
| 5,672,994 | A | 9/1997 | Au et al. |
| 5,748,025 | A | 5/1998 | Ng et al. |
| 5,973,380 | A | 10/1999 | Cutter et al. |
| 6,034,890 | A | 3/2000 | Satoh |
| 6,043,538 | A | 3/2000 | Allen et al. |
| 6,417,825 | B1 | 7/2002 | Stewart et al. |
| 6,608,355 | B1 * | 8/2003 | Ariyoshi et al. ............ 257/392 |
| 6,710,415 | B1 | 3/2004 | Ariyoshi et al. |

* cited by examiner

*Primary Examiner*—Fetsum Abraham
(74) *Attorney, Agent, or Firm*—Oliff & Berridge, PLC (57) ABSTRACT

An anti-fuse is manufactured by forming an isolation region including an insulating material layer buried in a surface of a device formation region on a surface of a semiconductor substrate, and by forming diffusion regions at both sides of the isolation region, then by contacting electrodes to the respective diffusion regions. The anti-fuse is initially in a non-conductive state, and is programmed to be in a permanently conductive state by a simple writing circuit.

18 Claims, 5 Drawing Sheets

SEMICONDUCTOR INTEGRATED CIRCUIT INCLUDING ANTI-FUSE AND METHOD FOR MANUFACTURING THE SAME

BACKGROUND OF THE INVENTION

1. Field of Invention

This invention relates to a semiconductor integrated circuit including an anti-fuse formed on a surface of a semiconductor substrate and a method for manufacturing the same.

2. Description of Related Art

Anti-fuses have been proposed that can be changed or programmed from a non-conductive state to a conductive state by applying a writing voltage, in a semiconductor integrated circuit. By programming specific anti-fuses to a conductive state, an internal circuit of the integrated circuit may be configured in a desirable operational state.

U.S. Pat. No. 5,973,380 discloses an anti-fuse including a pair of n+ regions closely spaced in a p-type substrate. The anti-fuse is converted to a state that conducts current from a state that blocks current flow by applying a breakdown voltage between the n+ regions.

However, an initial failure, in which leakage current flows before the anti-fuse is programmed, is likely to occur in the anti-fuse disclosed in this Patent.

U.S. Pat. No. 5,019,878 discloses a programmable device formed from a silicided MOS transistor. The device is programmable by applying a programming voltage, which is greater than or equal to the source-drain breakdown voltage, between the drain region and source region to form a conductive filament in the channel region that couples the drain region and the source region.

However, programming of this device requires applying a high voltage between the drain and source regions, and a suitable voltage to the gate electrode. Accordingly, a complicated programming circuit, or a writing circuit, that supplies the suitable voltage to the gate electrode in addition to the high voltage between the drain and source region, is required.

The assignee of this application already disclosed an anti-fuse device in U.S. patent application Ser. No. 10/076,652 (now U.S. Pat. No. 6,608,355), which is incorporated herein by reference in its entirety. In this prior application, it was proposed to decrease the breakdown voltage of a MOS transistor, which is used as an anti-fuse, by controlling the dopant concentration in the channel region. The decreased breakdown voltage decreases the required writing voltage and renders unnecessary the supply of a suitable voltage to the gate electrode during application of the writing voltage.

SUMMARY OF THE INVENTION

An object of this invention is to provide a semiconductor integrated circuit including an anti-fuse that is initially in a non-conducting state with a sufficiently low leakage current, but is reliably changed to a permanent conductive state by use of a writing circuit with a simple structure, and a method for manufacturing the same.

In the prior application describe above, a type of anti-fuse device was disclosed. In this application, another anti-fuse device which meets the object of this invention will be described.

According to various exemplary embodiments of this invention, a semiconductor integrated circuit includes a semiconductor substrate with a device formation region having a first conductivity-type on a surface thereof, anti-fuse, and a writing circuit formed on the surface of the semiconductor substrate. The anti-fuse includes an isolation region with an insulating material layer buried in a surface of the device formation region, diffusion regions having a second conductivity-type different from the first conductivity-type formed on the surface of the device formation region at both sides of the isolation region, and electrodes contacting the diffusion regions. The writing circuit applies a writing voltage between electrodes of the anti-fuse in order to change the anti-fuse from a non-conductive state to a permanently conductive state between the electrodes.

Exemplary methods for manufacturing a semiconductor integrated circuit on a surface of a semiconductor substrate according to this invention include forming an anti-fuse and a writing circuit on the surface of the semiconductor substrate. Forming an anti-fuse includes forming a device formation region having a first conductivity on the surface of the semiconductor substrate, the device formation region having an isolation region including an insulating material layer buried in a surface of the device formation region, forming diffusion regions on the surface of the device formation region at both sides of the isolation region, the diffusion regions having a second conductivity different from the first conductivity, and forming electrodes contacting the diffusion regions. The writing circuit applies a writing voltage between the electrodes to change the anti-fuse from a non-conductive state to a permanently conductive state between the electrodes.

According to another exemplary embodiment of this invention, a semiconductor integrated circuit includes a semiconductor substrate with a plurality of device formation regions having a first conductivity-type on a surface thereof, a plurality of anti-fuses formed in the respective device formation regions, and an internal circuit formed on the surface of the semiconductor substrate. Each of the anti-fuses includes an isolation region including an insulating material layer buried in a surface of a corresponding one of the device formation regions, diffusion regions having a second conductivity type different from the first conductivity-type formed on the surface of the corresponding one of the device formation regions at both sides of the isolation region, and electrodes contacting the diffusion regions. Each of the anti-fuses is changeable from a non-conductive state to a permanently conductive state between the electrodes by applying a writing voltage between the electrodes. The internal circuit is configured in a desired operational state by changing at least one of the anti-fuses to a permanently conductive state.

As will be explained in detail in the following paragraphs, the isolation region of the anti-fuse ensures a low leakage current in the initial state. Furthermore, the anti-fuse can reliably be changed to a permanently conductive state by simply applying a writing voltage between the electrodes.

DETAILED DESCRIPTION OF PREFERRED EMBODIMENTS

This invention was first described in Japanese Patent Application No. 2003-36847, which is incorporated herein by reference in its entirety.

A semiconductor integrated circuit according to various exemplary embodiments of this invention, and a method for manufacturing the same will now be described with reference to the drawings.

The semiconductor integrated circuit, according to an exemplary embodiment, includes an anti-fuse and a transistor constituting a writing circuit for applying an overvoltage (writing voltage) between electrodes of the anti-fuse to change the anti-fuse from a non-conductive state to a permanently conductive state. The semiconductor integrated circuit further includes other transistors constituting an internal circuit of the integrated circuit. Because the structure of the transistors is the same as that of known transistors, the description of the transistors is omitted, but the portion of the integrated circuit where the anti-fuse is formed is described below.

Figure 1:
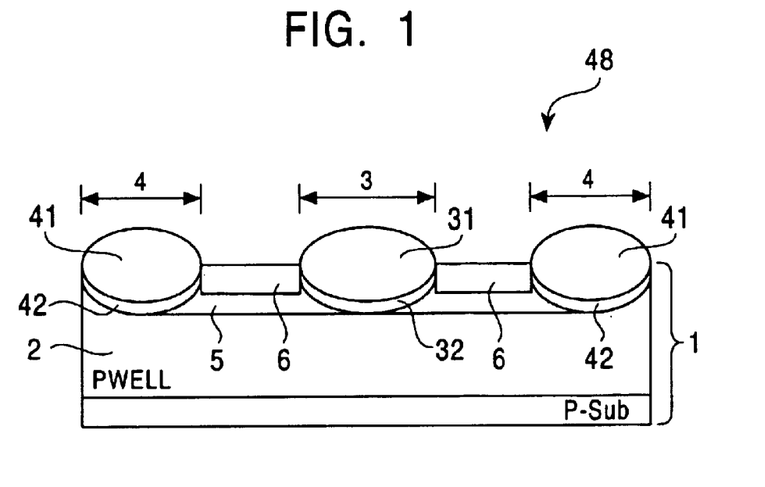
FIG. 1 is a schematic sectional view of a portion of a semiconductor integrated circuit including an anti-fuse according to an exemplary embodiment of this invention.

FIG. 1 is a schematic sectional view of a portion, in which an anti-fuse 48 is formed, of a semiconductor integrated circuit according to an exemplary embodiment of this invention.

As shown in FIG. 1, a p-well region 2, which is a device formation region where an anti-fuse 48 is formed, is formed on the surface of the semiconductor substrate 1, which is a silicon wafer, for example.

In the p-well region 2, a first isolation region 3 is formed that includes an insulating material layer 31 in the vicinity of its surface and a channel stop layer 32 in contact with the lower surface of the first insulating material layer 31. The channel stop layer 32 contains a p-type dopant at a concentration higher than that in the p-well region 2, and prevents leakage current resulting from the formation of an inversion layer.

Second isolation regions 4 are formed at both sides of the first isolation region 3, and each isolation region 4 includes a similar insulating material layer 41 and a channel stop layer 42.

A low breakdown voltage region (EP region) 5, spanning between the second isolation regions 4, is formed in the upper portion of the p-well region 2. In the example shown in FIG. 1, the low breakdown voltage region 5 has a thickness that extends from the surface of the p-well region 2 to a depth at which the channel stop layer 42 is formed. The low breakdown voltage region 5 contains a p-type dopant, such as boron, at a higher concentration than in the remaining portion of the p-well region 2. The low breakdown voltage region 5 reduces the breakdown voltage of the p-n junction and reduces the writing voltage of the anti-fuse 48, as described in U.S. patent application Ser. No. 10/076,652.

N-type diffusion regions 6, which constitute the anti-fuse 48, are formed in the surface of the low breakdown voltage region 5 between the first isolation region 3 and the second isolation regions 4 respectively. That is, PN junctions between the n-type diffusion regions 6 and the low breakdown voltage region 5 are formed at both sides of the first isolation region 3.

Implanting boron ions at, for example, an acceleration energy of 35 keV and a dosage of 3 to $10 \times 10^{12}$ cm$^{-2}$ forms the p-well region 2.

A known local oxidation of silicon (LOCOS) process is used to form the insulating material layers 31 and 41 of the first and second isolation regions 3 and 4. That is, a silicon nitride film is patterned to form openings corresponding to the isolation regions 3 and 4 and the surfaces of the semiconductor substrate 1 exposed by the openings are subsequently subjected to thermal oxidation (selective oxidation) using the silicon nitride film as an oxidation resistant film.

The resulting silicon oxide layers, which are formed by thermally oxidizing the surfaces of the semiconductor substrate 1 exposed by the openings serve as the insulating material layers 31 and 41. The thickness of the silicon oxide layers is, for example, in the range of from about 400 to about 800 nm, about half of which is buried in the surface of the semiconductor substrate 1.

Before the selective oxidation is performed, the surfaces of the semiconductor substrate 1 exposed by the openings are subjected to implantation of boron ions at, for example, an acceleration energy of 20 to 30 keV and a dosage of 1 to $10 \times 10^{13}$ cm$^{-2}$. By this doping of p-type dopant, the channel stop layers 32 and 42, in contact with the lower surfaces of the insulating material layers 31 and 41, are formed after the selective oxidation has taken place.

In various exemplary embodiments, the low breakdown voltage region (EP region) 5 is formed by, for example, implanting boron ions in the surface of p-well region 2 at an acceleration energy of 40 keV and a dosage of 1 to $3 \times 10^{14}$ cm$^{-2}$. The n-type diffusion regions 6 are formed by implanting arsenic ions at, for example, an acceleration energy of 75 keV and a dosage of 1 to $10 \times 10^{15}$ cm$^{-2}$.

The above-mentioned parameters may vary depending on the process used, and the manufacturing method is not limited to those parameters.

Although not shown in the figure, the n-type diffusion regions 6 are provided with electrodes. The electrodes are formed of, for example, aluminum-silicon alloy (AlSi), which is an aluminum-based alloy containing predominantly aluminum and, for example, 1 wt % of silicon.

It is preferable to provide the low breakdown voltage region 5 when the anti-fuse 48 and the transistor, formed on the same substrate and constituting a writing circuit for applying an overvoltage to the anti-fuse, are formed with the same manufacturing process. The low breakdown voltage region 5 reduces the breakdown voltage of the anti-fuse 48, and reduces the overvoltage required for writing the anti-fuse. Thus, deterioration of the transistor in the writing circuit resulting from the application of the writing voltage is prevented.

However, if the transistor of the writing circuit is formed on the same substrate with a different manufacturing process from the process used to form the anti-fuse, a low breakdown voltage region becomes unnecessary. In this instance, it is possible to increase the breakdown voltage of the transistor in the writing circuit by properly selecting the manufacturing process used for forming the transistor. Thus, deterioration of the transistor is prevented, even if the writing voltage of the anti-fuse is not reduced.

As shown in FIG. 1, the insulating material layers 31 and 41 formed by the LOCOS process are provided in regions above and below the surface of the semiconductor substrate 1 (p-well region 2). That is, the insulating material layer spans from a certain height above the surface of the semiconductor substrate 1 to a certain depth below the surface of the semiconductor substrate 1.

The regions in contact with the lower surface of the insulating material layers 31 and 41 are provided with channel stop layers 32 and 42, which contain a concentration of p-type dopant higher than that in the p-well region 2, by additionally implanting p-type ions, for example, boron ions, in the p-well region 2.

Among these structures, in particular, portions of insulating material layers 31 and 41 buried in the surface of the semiconductor substrate 1, i.e., the portions of the insulating material layers 31 and 41 extending from the surface of the semiconductor substrate 1 to a predetermined depth below the surface of the semiconductor substrate 1, and the channel stop layers 32 and 42 electrically isolate the two n-type diffusion regions 6.

That is, no leakage current flows between the n-type diffusion regions 6 even when a voltage within a normal operation range is applied between the electrodes, not shown in the figure. In other words, the anti-fuse 48 is in a non-conductive state with no leakage current between the two n-type diffusion regions 6.

In contrast, if an overvoltage (a writing voltage) is applied between the electrodes, the p-n junction between the low breakdown voltage region 5 and the n-type diffusion region 6, to which a positive voltage is applied, breaks down, and a reverse current flows.

The current flows from the electrode to which the positive voltage is applied, through the n-type diffusion region 6 connected to the electrode, to the low breakdown voltage region 5. The current passes through the low breakdown voltage region 5 under the insulating material layer 31 in the isolation region 3, further passes the n-type diffusion region 6 at the opposite side, and reaches the electrode to which a negative voltage is applied.

The current generates a flow of electrons traveling in the opposite direction, that is, from the negative electrode to the positive electrode, through the n-type diffusion region 6 connected to the negative electrode, the low breakdown voltage region 5 under the insulating material layer 31, and the opposite n-type diffusion region 6.

The electron flow created by the application of the writing voltage causes aluminum atoms in the negative electrode to flow into the low breakdown voltage region 5 under the insulating material layer 31 through the n-type diffusion region 6 connected to the negative electrode. At this moment, the p-n junction between the n-type diffusion region 6 connected to the negative electrode and the low breakdown voltage region 5 is permanently destroyed.

Furthermore, when aluminum atoms enter the low breakdown voltage region 5 under the insulating material layer 31 and reach the opposite n-type diffusion region 6, the p-n junction between the opposite n-type diffusion region 6 and the low breakdown voltage region 5 is also permanently destroyed. That is, electrical continuity is maintained between the electrodes, with no possibility of going back to the non-conductive state that was the case before the application of the overvoltage, even if the overvoltage is removed.

Thus, the anti-fuse is changed into a permanently conductive state in which a current can flow between the electrodes when a normal operating voltage is applied between the electrodes.

In practice, by further continuing to apply the overvoltage, the aluminum atoms entering from the negative electrode react with silicon atoms in the n-type diffusion regions 6 and the low breakdown voltage region 5 to form a conductive filament that connects the two electrodes. Thus, continuity can be achieved with an extremely low resistance of, for example, 100Ω or less, between the electrodes.

As described above, by providing two n-type diffusion regions 6 connected to respective electrodes containing aluminum, at both sides of the isolation region 3, an anti-fuse can be constructed. The anti-fuse is initially in a non-conductive state, which prevents leakage current from flowing, and can be changed into a permanent conductive state simply by applying an overvoltage.

On the contrary, in the structure disclosed in the above-cited U.S. Pat. No. 5,973,380, two diffusion regions 42 and 44 are provided adjacent to each other on a surface of a semiconductor substrate 46, without being separated by an isolation region. Therefore, leakage current flows between the diffusion regions in the initial state, i.e., after the completion of the manufacturing process and before applying an overvoltage. Therefore, the structure does not function as an anti-fuse.

Figure 2:
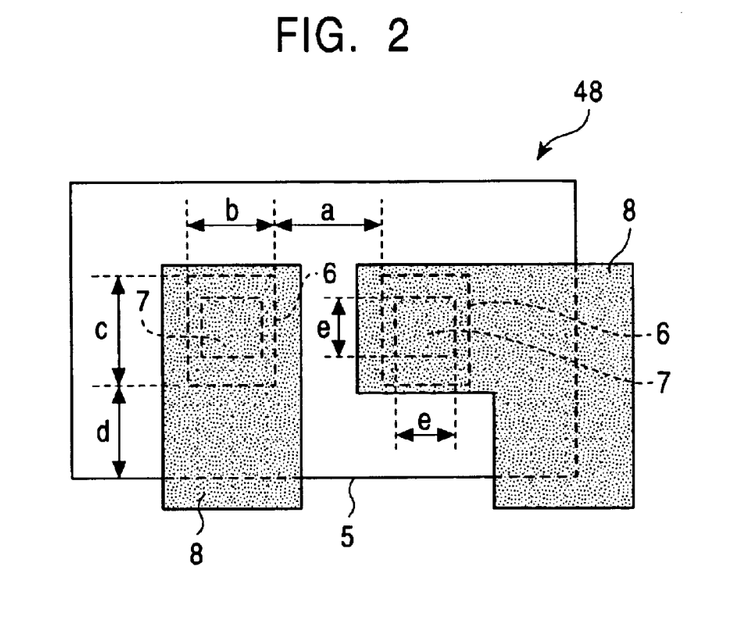
FIG. 2 is a schematic plan view of a portion of a semiconductor integrated circuit including an anti-fuse according to an exemplary embodiment of this invention.

It should be noted that the thick oxide layer 50 shown in FIG. 2 of U.S. Pat. No. 5,973,380 is merely intended to protect the surface of the semiconductor substrate 46 having diffusion regions 42 and 44 and to insulate the substrate from wires. However, the thick oxide layer 50 is not intended to function as the insulating material layer to separate the two diffusion regions 42 and 44.

Specifically, the thick oxide layer 50 is formed over the surface of the substrate 46, but does not have a portion buried within the surface of the substrate 46 to a predetermined depth. Furthermore, the structure has no channel stop layer.

Although the above description illustrates a structure having the low breakdown voltage region 5, basically the same operation can be realized in the case where the low breakdown voltage region 5 is not provided.

Specifically, the p-n junction between the n-type diffusion region 6, to which a positive voltage is applied, and the p-well region 2 is broken by applying an overvoltage so that current flows and hence generates an electron flow. The electron flow forces aluminum atoms in the negative electrode to flow into the p-well region 2 under the insulating material layer 31 through the n-type diffusion region 6 connected to the negative electrode, thereby permanently destroying the junction.

In either case, an overvoltage applied between the electrodes forces aluminum atoms in one of the electrodes to enter the device formation region under the isolation region through the n-type diffusion region 6 connected to this electrode, thereby changing the anti-fuse from a nonconductive state to a permanently conductive state.

In the semiconductor integrated circuit according to this exemplary embodiment, forming n-type diffusion regions 6 in a p-well region 2 forms an anti-fuse 48. Alternatively, the surface of a p-type semiconductor substrate may be used as a device formation region to form an anti-fuse without forming a p-well region. Furthermore, p-type diffusion regions may be formed in an n-well region to form an anti-fuse.

The LOCOS process, in which the surface of a silicon substrate is selectively oxidized, is not necessarily always used to form the first and second isolation regions. For example, a known shallow trench isolation (STI) process may be applied. That is, an insulating material, such as silicon oxide, may be buried in a trench, which is formed by etching the surface of a semiconductor substrate to a predetermined depth, to form an insulating material layer.

In this case, the entire insulating material layer is buried in the surface of the semiconductor substrate. That is, the insulating material layer is provided only in the region spanning from the surface of the semiconductor substrate to a predetermined depth below the surface of the semiconductor substrate.

FIG. 2 is a schematic plan view of a portion of a semiconductor integrated circuit including an anti-fuse according to an exemplary embodiment of this invention.

As shown in FIG. 2, two n-type diffusion regions 6 are disposed in a low breakdown voltage region 5 formed in an upper portion of a p-well region. The surroundings of the low breakdown voltage region 5 and the region other than the n-type diffusion regions 6 in the low breakdown voltage region 5 are isolation regions including insulating material layers and channel stop layers, not shown in the figure.

The n-type diffusion regions 6 are covered with an interlayer insulating film, not shown in the figure, having two contact holes 7 smaller than the n-type diffusion regions 6, for connecting electrodes to the respective n-type diffusion regions. An aluminum alloy electrode is formed in each contact hole 7, and is connected to a wire 8 formed from the same aluminum alloy on the interlayer insulating film.

According to an exemplary embodiment, in the anti-fuse according to the exemplary embodiment, the distance a between the n-type diffusion regions 6 separated by the isolation region, not shown in the figure, is 1.0 μm; the n-type diffusion regions 6 each measure 3.4 μm (b) by 4.0 μm (c); and the contact holes 7 each measure 1.4 μm by 1.4 μm (e). The distance d between the outer edge of the n-type diffusion regions 6 and the outer edge of the low breakdown voltage region 5 may be set at zero in the design specifications. In the exemplary embodiment shown in FIG. 2, however, the low breakdown voltage region 5 is larger than the n-type diffusion regions 6.

These sizes depend on the specific design specifications, and are not limited to the values above.

Figure 3:
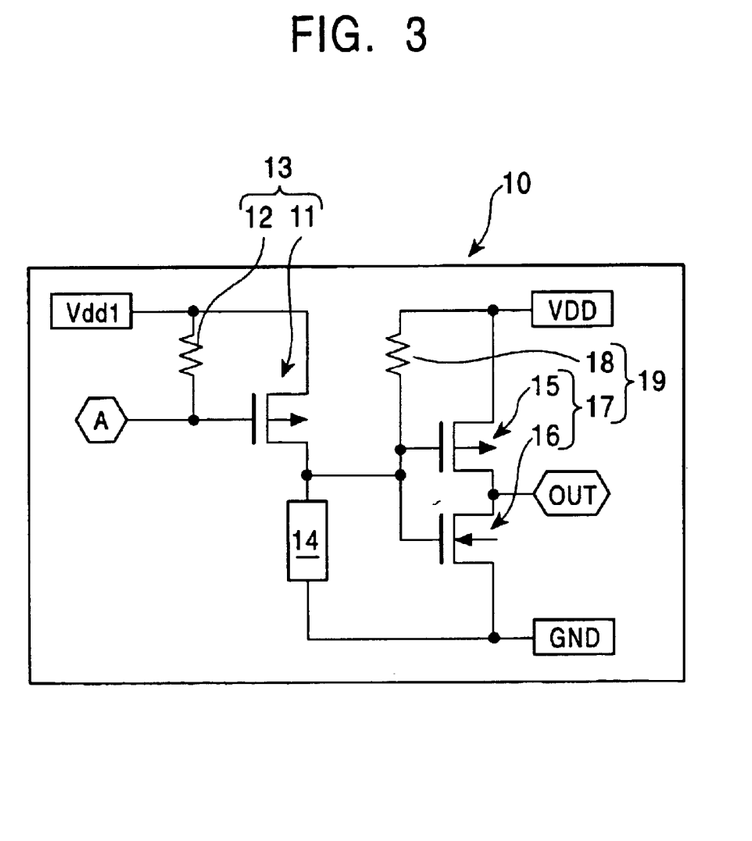
FIG. 3 is a one-bit memory circuit, including an anti-fuse and a transistor constituting a writing circuit for applying a writing voltage to the anti-fuse, in an exemplary embodiment of a semiconductor integrated circuit according to this invention.

A one-bit memory circuit and an internal circuit of the semiconductor device according to an exemplary embodiment of this invention will now be described. FIG. 3 is a one-bit memory circuit of an exemplary semiconductor integrated circuit according to this invention, including an anti-fuse and a transistor constituting a writing circuit for writing the anti-fuse into a permanently conductive state.

The one-bit memory circuit 10 of the semiconductor integrated circuit according to an exemplary embodiment of this invention and shown in FIG. 3, includes a writing circuit 13, an anti-fuse 14, a reading circuit 19, a writing power-supply terminal Vdd1, an input terminal A, a reading circuit power-supply terminal VDD, a ground terminal GND, and an output terminal OUT.

The writing circuit 13 includes a p-type MOS transistor 11 and a resistor 12 for voltage adjustment. The anti-fuse 14 changes from a non-conductive state to a conductive state by applying a writing voltage between the electrodes from the writing circuit 13. The reading circuit 19 includes an inverter 17 including a p-type MOS transistor 15 and an n-type MOS transistor 16, and a resistor 18 for voltage adjustment.

The writing power-supply terminal Vdd1 is intended for connection to, for example, an 8 V high voltage power supply, and is connected to the source electrode of the p-type MOS transistor 11. The input terminal A, to which writing signal is input, is connected to the gate electrode of the p-type MOS transistor 11. The voltage-adjusting resistor 12 is connected between the writing power-supply terminal Vdd1 and the input terminal A.

The drain electrode of the p-type MOS transistor 11 is connected to one of the electrodes of the anti-fuse 14, and to the gate electrode of the p-type MOS transistor 15 and the gate electrode of the n-type MOS transistor 16 of the inverter 17. The other electrode of the anti-fuse 14 is connected to the ground terminal GND.

Furthermore, the source electrode of the p-type MOS transistor 15 of the inverter 17 is connected to the reading circuit power-supply terminal VDD, and the source electrode of the n-type MOS transistor 16 is connected to the ground terminal GND. The voltage-adjusting resistor 18 is connected between the reading circuit power-supply terminal VDD and the gate electrodes of the p-type and of the n-type MOS transistors 15 and 16. The drain electrodes of the p-type and of the n-type MOS transistors 15 and 16 are connected to the output terminal OUT.

The reading circuit power-supply terminal VDD is connected to, for example, a 5 V or 3.3 V internal circuit power supply.

When a high voltage for writing is applied to the writing power-supply terminal Vdd1, and logic 1 is input to the input terminal A of the one-bit memory circuit 10, the p-type MOS transistor 11 of the writing circuit 13 turns off. Because the high voltage is not applied to the anti-fuse 14, the anti-fuse 14 remains in a non-conductive state. On the other hand, when logic 0 is input to the input terminal A, the p-type MOS transistor 11 turns on and the high voltage is applied to the anti-fuse 14. Thus, the anti-fuse 14 is programmed to a conductive state.

In the reading circuit 19, when the internal circuit power is supplied to the reading circuit power-supply terminal VDD, and if the anti-fuse 14 is in a non-conductive state, the gate electrodes of the p-type and of the n-type MOS transistors 15 and 16 of the inverter 17 are not short-circuited to the ground terminal GND, and they are placed in a logic high state. Thus, logic 0 is output from the output terminal OUT.

If the anti-fuse 14 is in a conductive state, the gate electrodes of the p-type and of the n-type MOS transistors 15 and 16 of the inverter 17 are short-circuited to the ground terminal GND, and are placed in a logic low state. Thus, logic 1 is output from the output terminal OUT.

Figure 4:
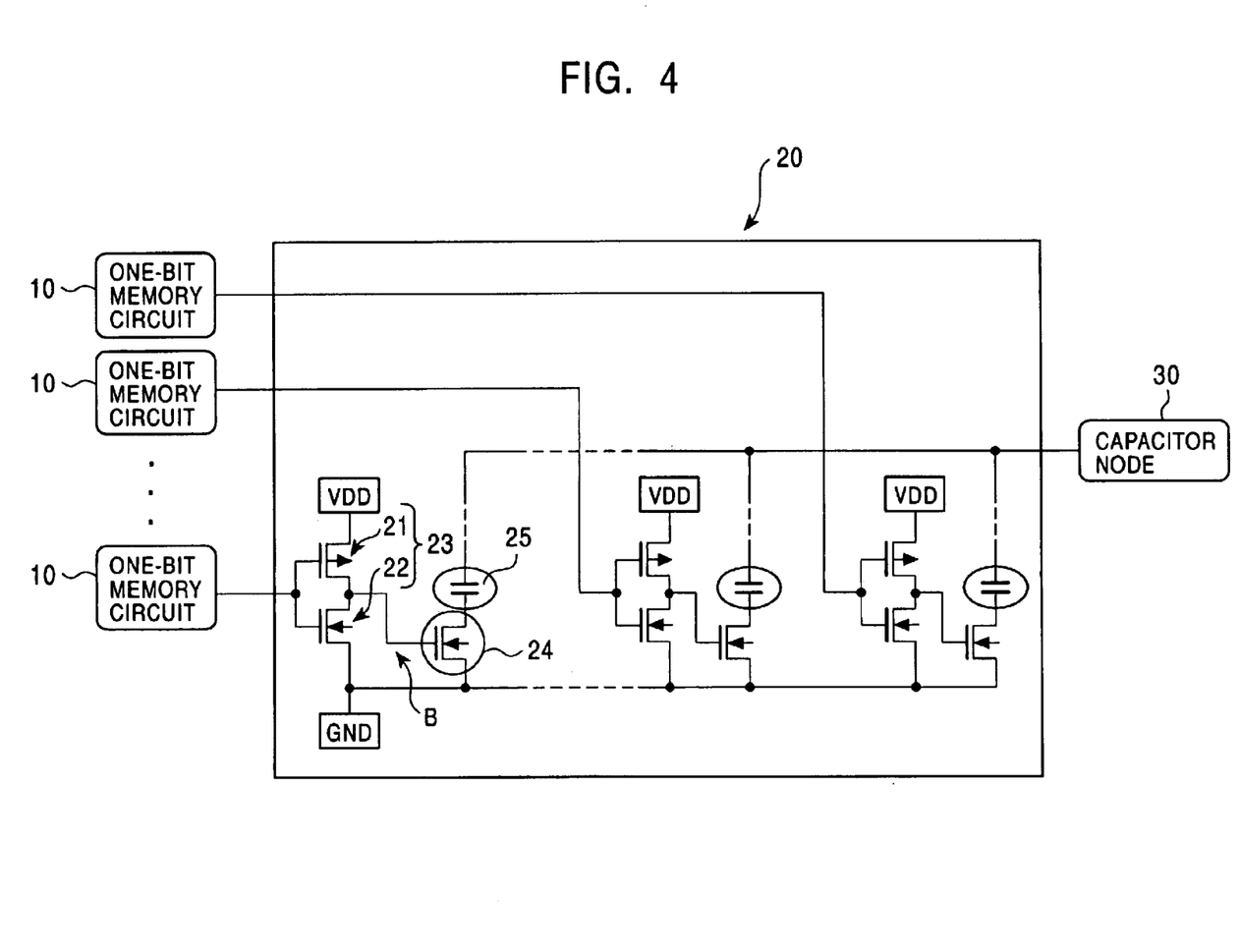
FIG. 4 is a representation of an internal circuit, whose operational state is changed according to the logical state of the one-bit memory circuits, in a semiconductor integrated circuit according to an exemplary embodiment of this invention.

FIG. 4 is a representation of an internal circuit of the semiconductor integrated circuit according to an exemplary embodiment of this invention. The operational state of the internal circuit changes according to the logical state of the one-bit memory circuit.

The internal circuit 20 shown in FIG. 4 includes a plurality of inverters 23, each including a p-type MOS transistor 21 and an n-type MOS transistor 22, a plurality of capacitors 25, and a plurality of n-type MOS transistors 24.

The source electrodes of the p-type MOS transistor 21 and of the n-type transistor 22 of each inverter 23 are connected to the power-supply terminal VDD and the ground terminal GND, respectively. The gate electrodes of the MOS transistors 21 and 22 in each inverter 23 are connected to the output terminal OUT in each one of the one-bit memory circuits 10, which are shown in FIG. 3.

The drain electrodes of the p-type and of the n-type MOS transistors 21 and 22 are connected to the gate electrode of the n-type MOS transistor 24. The drain electrode of each n-type MOS transistor 24 is connected to a capacitor node 30 through the corresponding capacitor 25, and the source electrodes of the n-type MOS transistors 24 are connected to the ground terminal GND. The power-supply terminal VDD is connected to, for example, an internal circuit power supply common to the reading circuit 19 of the one-bit memory circuit 10.

When logic 1 is output from the output terminal OUT of the one-bit memory circuit 10, the logic of the node B connected to the gate electrode of the n-type MOS transistor 24, output from the inverter 23 of the internal circuit 20 becomes zero and the n-type transistor 24 turns off. Thus, the capacitance of the capacitor 25 is not added to the capacitor node 30.

In contrast, when logic 0 is outputted from the output terminal OUT of the one-bit memory circuit 10, the logic of the node B connected to the gate electrode of the n-type MOS transistor 24, outputted from the inverter 23 of the internal circuit 20 becomes 1 and the n-type transistor 24 turns on. Thus, the capacitance of the capacitor 25 is added to the capacitor node 30.

Thus, in the semiconductor integrated circuit according to this invention, desired one-bit memory circuits 10 are selected, and the anti-fuses of the selected one-bit memory circuits 10 are programmed into a conductive state. Thus, the internal circuit 20 is set or configured to be in a desired operational state. Specifically, in this exemplary embodiment, the capacitance of the capacitor node 30 can be set at a desired value. The set value of the capacitor node 30 is used to, for example, set the oscillation frequency of an oscillator circuit integrated in the same semiconductor integrated circuit at a desired value.

An exemplary method for manufacturing the semiconductor integrated according to this invention will now be described. FIGS. 5 to 10 are schematic representations of progressing steps for manufacturing a semiconductor integrated circuit according to various exemplary embodiments of this invention using a 1-µm process.

Figure 5:
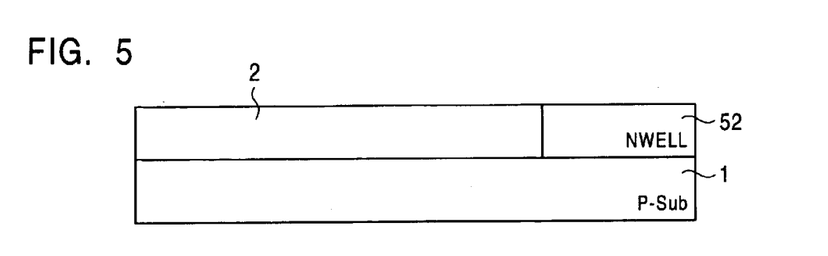
FIG. 5 is a schematic illustration of a process step in an exemplary method for manufacturing a semiconductor integrated circuit according to this invention.

First, as shown in FIG. 5, a portion of the surface of a p-type silicon substrate 1 is doped with a p-type dopant, such as boron, for instance, by ion implantation or the like, to form a p-well region 2. Another portion of the surface of the substrate 1 is doped with an n-type dopant, such as, for instance, phosphorous or arsenic, for instance by ion plantation, or the like, to form an n-well region 52.

Figure 6:
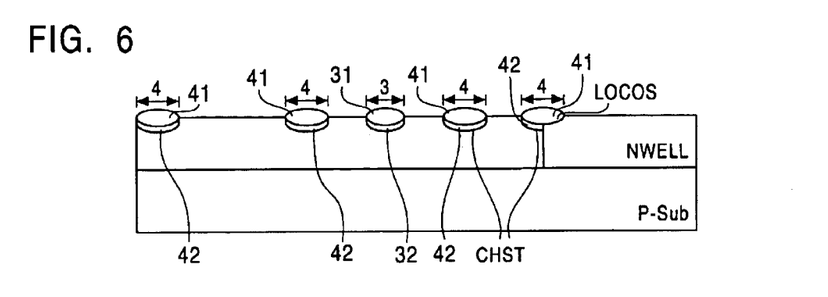
FIG. 6 is a schematic illustration of a process step, following the step shown in FIG. 5, of an exemplary method for manufacturing a semiconductor integrated circuit according to this invention.

Then, a plurality of isolation regions 3 and 4 are formed at the surfaces of the p-well region 2 and the n-well region 52 by, for instance, the known LOCOS process, as shown in FIG. 6. In this instance, after patterning a silicon nitride film, for example, boron ions are implanted into the surface of the p-well region 2 through the openings formed by removing the silicon nitride film. Subsequently, insulating material layers, or LOCOS oxide layers, are formed by selective oxidation using the patterned silicon nitride film as an anti-oxidation film. Thus, channel stop layers (CHST) 32 and 42 are formed in contact with the lower surfaces of the insulating material layers 31 and 41 in isolation regions 3 and 4.

The isolation regions include a first isolation region 3 and second isolation regions 4. The first isolation region 3 is used for isolating the diffusion regions of the anti-fuse from each other. The second isolation regions 4 are used for isolating transistors constituting the writing circuit and the internal circuit from one another and for isolating the anti-fuse from the transistors.

The first isolation region 3 and the second isolation regions 4 may be formed at the same time. Hence, it is not necessary to perform an additional step for forming the first isolation region 3 of the anti-fuse. Specifically, selective oxidation is performed using a silicon nitride film patterned so as to provide openings in the first and second isolation regions, and, thus, the insulating material layers 31 and 41 are simultaneously formed in the first isolation region and the second isolation regions, respectively.

The first insulating material layer 31 and the second insulating material layers 41, therefore, may have the same thickness. In other words, each insulating material layer is formed within the surface of the device formation regions (p-well region 2 and n-well region 52) and has the same depth.

In actual, the simultaneous formation of the first insulating material layer 31 and the second insulating material layer 41 does not ensure the exactly the same thicknesses of these layers due to non-uniformity of the process. Nonetheless, the thicknesses of the insulating material layers or the depths to which the insulating material layers are buried in the first and second isolation regions are substantially the same, as long as the minor variations resulting from the non-uniformities inherent in the manufacturing processes are neglected.

The second isolation regions 4 are formed not only within the p-well region 2, but also at the boundary between the p-well region 2 and the n-well region 52, as shown in FIG. 6. In addition, the second isolation regions 4 are also formed within the n-well region 52, but not shown in the figure. The entire first isolation region 3 and the second isolation regions 4 can be formed at one time.

The channel stop region 32 in the first isolation region 3 and the channel stop regions 42 in the second isolation regions 4 can also be formed at the same time. These channel stop regions therefore contain the same concentration of p-type dopant, such as, for instance, boron.

However, after the below-described low breakdown voltage region 5 (EP region) is formed, the channel stop region 32 in the first isolation region actually contains the p-type dopant in a concentration higher than that in the channel stop regions 42 in the second isolation regions 4, because the first isolation region 3 is additionally doped with the p-type dopant.

When the LOCOS process is used to form the isolation regions 3 and 4, as shown in FIGS. 5 and 6, it is conventional to form the p-well region 2 and the n-well region 52 before forming the insulating material layers 31 and 41. When the STI process is used to form the isolation regions 3 and 4, on the other hand, the p-well region 2 and the n-well region 52 are usually formed after forming the insulating material layers 31 and 41. In either case, after forming the well regions and the insulating material layers, device formation regions (well regions) having isolation regions are formed, as shown in FIG. 6.

Figure 7:
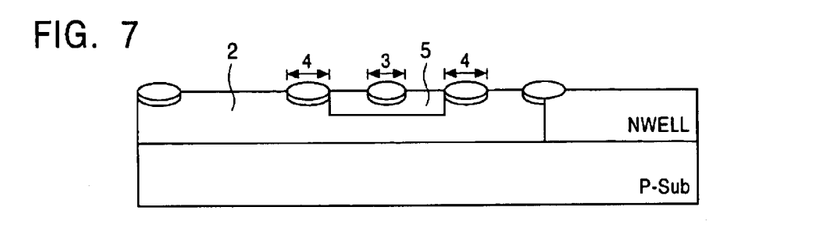
FIG. 7 is a schematic illustration of a process step, following the step shown in FIG. 6, of an exemplary method for manufacturing a semiconductor integrated circuit according to this invention.

As shown in FIG. 7, boron ions, for instance, are implanted into the surface of the p-well region 2 between the second isolation regions 4, in which the anti-fuse will be formed, at both sides of the first isolation region 3. Thus, a low breakdown voltage region 5 (EP region) is formed. For the formation of the low breakdown voltage region 5, boron ions, for instance, are implanted, for example, at an acceleration energy of 40 keV and at a dosage of $2.5 \times 10^{14}$ cm$^{-2}$.

Alternatively, the implantation for forming the low breakdown voltage region 5 may be performed before the selective oxidation for forming the insulating material layers 31 and 41.

Figure 8:
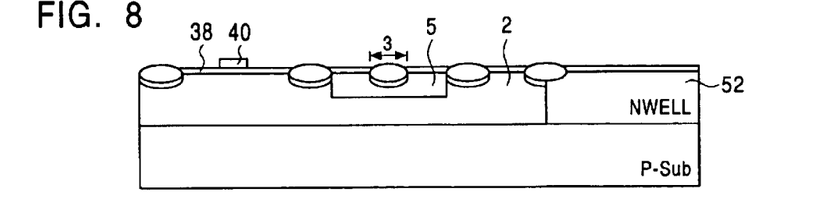
FIG. 8 is a schematic illustration of a process step, following the step shown in FIG. 7, of an exemplary method for manufacturing a semiconductor integrated circuit according to this invention.

As shown in FIG. 8, a gate dielectric film 38 is formed on the surfaces of the p-well region 2 and the n-well region 52 by, for example, thermal oxidation. Subsequently, a polycrystalline silicon film is deposited over the entire surface of the gate dielectric film 38 and patterned to form gate electrodes 40 for transistors. At the same time, gate electrodes are also formed on the surface of the gate dielectric film 38 over the n-well region 52, but not shown in the figure.

The gate electrode 40 over the p-well region 2 is of an n-type MOS transistor, and the gate electrode over the n-well region 52 is of a p-type MOS transistor.

Figure 9:
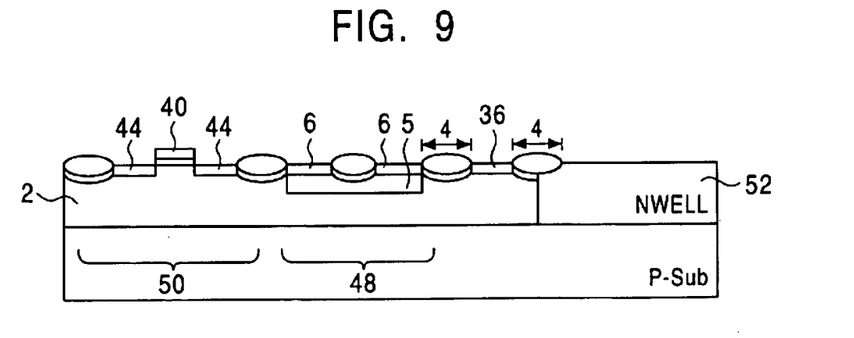
FIG. 9 is a schematic illustration of a process step, following the step shown in FIG. 8, of an exemplary method for manufacturing a semiconductor integrated circuit according to this invention.

Then, arsenic ions, for instance, are implanted into the surface of the low breakdown voltage region 5 at both sides of the first isolation region 3, thereby forming n-type diffusion region 6 of the anti-fuse 48, containing a high concentration of n-type dopant, as shown in FIG. 9. Arsenic ions are thus also implanted into the regions at both sides of the gate electrode 40 over the p-well region 2 to form source and drain diffusion regions 44 of the n-type MOS transistor 50.

Hence, it is not necessary to perform an additional step for forming the n-type diffusion regions 6 of the anti-fuse 48. The source and drain diffusion regions 44 of the n-type MOS transistor 50 may be formed simultaneously with the n-type diffusion region 6 of the anti-fuse 48, that is, during the same ion implantation step. These diffusion regions, therefore, have substantially the same depth, and contain the same dopant with the same concentration.

The exact depth (junction depth) of the n-type diffusion region 6 of the anti-fuse 48 is, in fact, slightly smaller than that of the source and drain diffusion regions 44 of the n-type MOS transistor, because the former is formed in the high breakdown voltage region 5 containing a higher concentration of p-type dopant. However, the depths are substantially the same as long as such minor difference is neglected.

For the formation of the n-type diffusion regions 6, for example, arsenic ions, for instance, are implanted at an acceleration energy of 70 keV and at a dosage of $5 \times 10^{15}$ cm$^{-2}$.

In addition, the region between predetermined second isolation regions 4 within the p-well region 2 is doped with, for example, boron to form a p-type diffusion region 36 containing a high concentration of p-type dopant. The p-type diffusion region 36 is used to contact an electrode for applying a predetermined voltage to the p-well region 2.

Furthermore, p-type source and drain diffusion regions not shown in the figure, may be formed at both sides of the gate electrodes over the n-well region 52, simultaneously with the formation of the p-type diffusion region 36.

Figure 10:
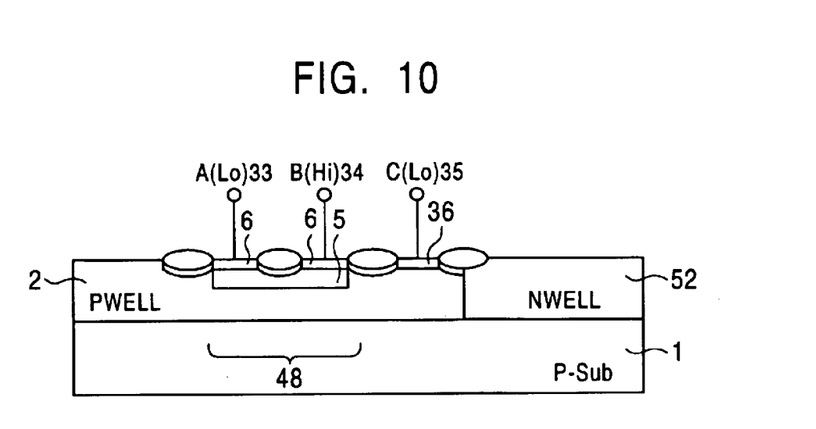
FIG. 10 is a schematic illustration of a process step, following the step shown in FIG. 9, of an exemplary method for manufacturing a semiconductor integrated circuit according to this invention.

Finally, aluminum alloy electrodes 33 and 34 are formed to contact the respective n-type diffusion regions 6 of the anti-fuse 48, as shown in FIG. 10. One of the electrodes serves as a cathode 33 connected to the ground terminal GND in the circuit shown in FIG. 3, and the other serves as an anode 34.

At the same time, an electrode 35 contacting the p-type diffusion region 36 may be formed. The electrode 35 is used for supplying the ground potential to the p-well region 2 in which the anti-fuse 48 is formed.

In addition, the source and drain diffusion regions and the gate electrodes of n-type and p-type MOS transistors formed on the same semiconductor substrate are each provided with an aluminum alloy electrode, which is not shown in the figure.

A known process forms the electrodes. For example, an insulating film (interlayer insulating film) is formed over the entire surface of the semiconductor substrate 1, as shown in FIG. 9. Contact holes are formed at positions where the electrode will be formed, so as to expose the diffusion regions at the bottoms of the contact holes. An aluminum alloy film is deposited over the interlayer insulating film and in the contact holes, and is patterned. In this instance, electrodes in the contact holes for contacting the diffusion regions and wires on the interlayer insulating film for connecting between the electrodes are simultaneously formed.

The above-described steps of the method for manufacturing the semiconductor integrated circuit according to an exemplary embodiment of this invention may be the same as the conventional steps for manufacturing CMOS semiconductor integrated circuits including no anti-fuse, except for the step of ion implantation for forming the low breakdown voltage region 5. The semiconductor integrated circuit according to an exemplary embodiment of this invention can therefore be manufactured at a low cost, substantially the same as that of a conventional semiconductor integrated circuit including no anti-fuse.

The low breakdown voltage region 5 may be unnecessary if the transistor of the writing circuit is manufactured with a process different from the one used for manufacturing the anti-fuse.

The properties of the anti-fuse, according to an exemplary embodiment of this invention, with the plan dimensions shown in FIG. 2, prepared by a 1-µm process, were examined. The results are as follows:

Writing voltage for changing to permanently conductive state between the electrodes 33 and 34: 8 V;
Resistance before writing: about 100 GΩ;
Resistance after writing: 100Ω or less;
Initial yield: 100% (criterion: resistance>1 GΩ)
Writing yield: 100% (criterion: resistance<1 kΩ)

Thus, it has been shown that the anti-fuse 48 prepared by the exemplary method according to this invention is in a non-conductive state without leakage in its initial state and is reliably changed to a conductive state with an extremely low resistance by applying a writing voltage.

In contrast, a device having two diffusion regions with no isolation region, as described in U.S. Pat. No. 5,973,380, resulted in an initial yield of zero even if the distance between the diffusion regions was extended to twice the distance shown in FIG. 2. That is, the device shown in this reference does not function as an anti-fuse.

The above-described exemplary embodiment illustrates a method based on a 1-µm process. However, the above-described manufacturing steps can be applied to a process with design rules less than 1.0 µm, and result in the same advantageous properties. However, the manufacturing process and the structure of the electrodes may have to be changed according to such design rules.

In the above-described 1-µm process, an AlSi alloy film is deposited in the contact holes and on the interlayer insulating film, and the deposited film is patterned to form the electrodes and wires. If an AlSi Alloy is used to form fine wires in a highly miniaturized semiconductor integrated circuit, however, Si atoms in the AlSi alloy may precipitate to form nodules, and degrade the electromigration reliability.

Accordingly, for example, aluminum alloy containing 0.5 wt % of copper, but no Si (hereinafter represented as AlCu alloy), is used in a manufacturing process of 0.8 µm or less.

Also, it is difficult to deposit an aluminum alloy film in highly miniaturized contact holes. Accordingly, another structure may be adopted in which a contact hole is filled with a plug. That is, an adhesion layer is formed on the bottom surface and on the sidewall of the contact hole, and a tungsten film is deposited on the adhesion layer by CVD (chemical vapor deposition) so as to fill the contact hole. Then, the tungsten film deposited over the surface of the interlayer insulating film is etched back to form a plug filling the contact hole.

Unfortunately, if the contact hole of an anti-fuse is filled with a tungsten plug, the tungsten plug blocks aluminum atoms in the electrode from flowing into the device formation region. Consequently, the anti-fuse cannot be changed into a permanently conductive state even if an overvoltage is applied to generate electron flow.

As a countermeasure, the contact hole of the anti-fuse is formed to have a size larger than that of contact holes for other devices such as a transistor. The thickness of the tungsten film is selected to fill the contact holes of other devices, but does not fill the contact hole of the anti-fuse. The tungsten film is subjected to etchback in such a manner as to expose the adhesion layer on the bottom of the contact hole of the anti-fuse, while forming plugs in the contact holes of other devices.

Thus, the electrode formed of AlCu alloy contacts the diffusion region of the anti-fuse through the adhesion layer exposed at the bottom of the contact hole. The inventors have confirmed that the anti-fuse with this structure can be written by applying the same overvoltage as in the case where the AlSi alloy electrode directly connects the diffusion region.

In general, the two diffusion regions are connected to respective electrodes having the same structure and formed of the same material. However, it is possible to form the electrodes in different structures and/or from different materials.

For example, the cathode electrode, which supplies the aluminum atoms that enter and destroy the junction formed in the device formation region, may be formed from aluminum or aluminum alloy and contacts the diffusion region directly or through an adhesion layer. On the other hand, the anode electrode may be connected to the diffusion region through a tungsten plug.

The integrated circuit shown in FIG. 9 includes the anti-fuse 48 and the n-type MOS transistor 50 formed in the same p-well region 2. Specifically, a part of the p-well region 2 is used as the device formation region to form the anti-fuse 48, and another part of the p-well region 2 is used as the device formation region to form the n-type MOS transistor 50.

However, another p-well region may be provided for the n-type MOS transistor separately from that for the anti-fuse. Respective p-well regions may be used as device formation regions for forming the anti-fuse and the n-type MOS transistor.

In the exemplary embodiment described above, the electrode is made of an aluminum alloy film. That is, aluminum is used as a metal to flow into the device formation region under the insulating material layer and to destroy the junction of the anti-fuse. This invention is not limited to this embodiment, and other metals may be used to form the electrode.

For example, metals that produce silicides, such as titanium, as disclosed in U.S. Pat. No. 5,019,878, may also be used to form the electrode. Other metals such as gold, copper, and silver may also be used to form the electrode.

The electrode of the anti-fuse may be formed of one of these metals, or of an alloy that predominantly contains one of these metals. Alternatively, the electrode may be formed in a layered structure including a layer of other materials in addition to a layer containing one of these metals, as long as the layer of the other materials does not hinder the movement of the metal to flow into the device formation region.

As described above, by providing an isolation region between two diffusion regions, an anti-fuse can be constructed. The anti-fuse is in a non-conducting state without leakage in its initial state, and can be changed to a permanently conductive state by simply applying an overvoltage between the two electrodes using a write circuit having a simple structure. According to the method for manufacturing a semiconductor integrated circuit of an exemplary embodiment of this invention, a semiconductor integrated circuit including the anti-fuse can be manufactured through substantially the same process as that of conventional semiconductor integrated circuits including no anti-fuse.

What is claimed is:

1. A semiconductor integrated circuit comprising:
 a semiconductor substrate with a device formation region on a surface thereof, the device formation region having a first conductivity-type;
 an anti-fuse comprising:
  a first isolation region including an insulating material layer buried in a surface of the device formation region;
  diffusion regions formed on the surface of the device formation region at both sides of the first isolation region, the diffusion regions having a second conductivity-type different from the first conductivity-type; and
  electrodes contacting the diffusion regions; and
 a writing circuit formed on the surface of the semiconductor substrate, the writing circuit applying a writing voltage between the electrodes of the anti-fuse to change the anti-fuse from a non-conductive state to a permanently conductive state between the electrodes.

2. The semiconductor integrated circuit according to claim 1, wherein the first isolation region further includes a channel stop layer for preventing formation of an inversion layer in contact with a lower surface of the insulating material layer.

3. The semiconductor integrated circuit according to claim 1, further comprising a plurality of transistors and second isolation regions formed on the surface of the semiconductor substrate, the second isolation regions isolating the transistors from each other, wherein the insulating material layer of the first isolation region is buried in the surface of the device formation region to a first depth, and each of the second isolation regions includes a second insulating material layer buried in the surface of the semiconductor substrate to a depth substantially the same as the first depth.

4. The semiconductor integrated circuit according to claim 3, wherein the transistors include MOS transistors having source and drain diffusion regions of the second conductivity-type, a depth of the source and drain diffusion regions of the MOS transistors is substantially the same as that of the diffusion regions of the anti-fuse.

5. The semiconductor integrated circuit according to claim 1, wherein:
the anti-fuse further includes a low breakdown voltage region formed in an upper portion of the device formation region, the low breakdown voltage region contains dopant of the first conductivity-type with a concentration higher than that of a lower portion of the device formation region; and
the diffusion regions of the anti-fuse are formed in the low breakdown voltage region.

6. The semiconductor integrated circuit according to claim 1, wherein at least one of the electrodes is formed of aluminum or an aluminum alloy.

7. The semiconductor integrated circuit according to claim 1, wherein the device formation region is a well region formed in the surface of the semiconductor substrate.

8. A method for manufacturing a semiconductor integrated circuit on a surface of a semiconductor substrate, the method comprising:
forming an anti-fuse on the surface of the semiconductor substrate, the forming including:
forming a device formation region having a first conductivity-type on the surface of the semiconductor substrate, the device formation region having a first isolation region including an insulating material layer buried in a surface of the device formation region;
forming diffusion regions on the surface of the device formation region at both sides of the isolation region, the diffusion regions having a second conductivity-type different from the first conductivity-type, and
forming electrodes contacting the diffusion regions; and
forming a writing circuit on the surface of the semiconductor substrate, the writing circuit applying a writing voltage between the electrodes to change the anti-fuse from a non-conductive state to a permanently conductive state between the electrodes.

9. The method according to claim 8, wherein the first isolation region is formed by one of local oxidation of silicon (LOCOS) process and shallow trench isolation (STI) process.

10. The method according to claim 8, wherein the forming of the device formation region further includes adding at least one dopant of the first conductivity-type into the isolation region to form a channel stop layer under the insulating material layer.

11. The method according to claim 8, further comprising forming a plurality of transistors and second isolation regions on the surface of the semiconductor substrate, the second isolation regions isolating the transistors from each other,
wherein the first isolation region of the anti-fuse is formed simultaneously with the second isolation regions.

12. The method according to claim 11, wherein the transistors include source and drain diffusion regions formed in the surface of the semiconductor substrate, and the source and drain diffusion regions of the transistors are formed simultaneously with the diffusion regions of the anti-fuse.

13. A semiconductor integrated circuit comprising:
a semiconductor substrate with a plurality of device formation regions on a surface thereof, the device formation regions having a first conductivity-type;
a plurality of anti-fuses formed in the respective device formation regions, each of the anti-fuses comprising a first isolation region including an insulating material layer buried in a surface of a corresponding one of the device formation regions, diffusion regions having a second conductivity type different from the first conductivity-type formed on the surface of the corresponding one of the device formation regions at both sides of the first isolation region, and electrodes contacting the diffusion regions, each of the anti-fuses being changeable from a non-conductive state to a permanently conductive state between the electrodes by applying a writing voltage between the electrodes; and
an internal circuit formed on the surface of the semiconductor substrate, the internal circuit being configured in a desired operational state by changing at least one of the anti-fuses to the permanently conductive state.

14. The semiconductor integrated circuit according to claim 13, wherein each of the first isolation regions further includes a channel stop layer for preventing formation of an inversion layer in contact with a lower surface of the insulating material layer.

15. The semiconductor integrated circuit according to claim 13, wherein:
the internal circuit includes a plurality of transistors and a plurality of second isolation regions formed on the surface of the semiconductor substrate, the second isolation regions isolating the transistors from each other; and
the insulating material layer of each of the first isolation regions is buried in the surface of the corresponding one of the device formation regions to a first depth, and each of the second isolation regions includes a second insulating material layer buried in the surface of the semiconductor substrate to a depth substantially the same as the first depth.

16. The semiconductor integrated circuit according to claim 15, wherein the transistors include MOS transistors having source and drain diffusion regions of the second conductivity-type, a depth of the source and drain diffusion regions of the MOS transistors is substantially the same as that of the diffusion regions of the anti-fuses.

17. The semiconductor integrated circuit according to claim 13, wherein:
each of the anti-fuses further includes a low breakdown voltage region formed in an upper portion of the corresponding one of the device formation regions, the low breakdown voltage region contains dopant of the first conductivity-type with a concentration higher than that of a lower portion of the corresponding one of the device formation regions; and
the diffusion regions of each of the anti-fuses are formed in the low breakdown voltage region of the corresponding one of the device formation regions.

18. The semiconductor integrated circuit according to claim 13, wherein the device formation regions are well regions formed in the surface of the semiconductor substrate.

* * * * *